United States Patent
Choo et al.

(10) Patent No.: US 7,973,683 B2
(45) Date of Patent: Jul. 5, 2011

(54) APPARATUS AND METHOD FOR LOSSLESS CODING AND DECODING

(75) Inventors: Ki Hyun Choo, Seoul (KR); Konstantin Osipov, St. Petersburg (RU); Anton V. Porov, St. Petersburg (RU)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 12/320,288

(22) Filed: Jan. 22, 2009

(65) Prior Publication Data
US 2010/0052956 A1    Mar. 4, 2010

(30) Foreign Application Priority Data

Aug. 28, 2008  (KR) ................. 10-2008-0084368

(51) Int. Cl.
*H03M 7/00* (2006.01)
(52) U.S. Cl. .......................... 341/107; 341/51
(58) Field of Classification Search .................. 341/50, 341/51, 107, 63
See application file for complete search history.

(56) References Cited

U.S. PATENT DOCUMENTS

| | | | | |
|---|---|---|---|---|
| 5,818,877 | A * | 10/1998 | Tsai et al. | 375/241 |
| 7,535,387 | B1 * | 5/2009 | Delva | 341/107 |
| 7,587,092 | B2 * | 9/2009 | Cai et al. | 382/239 |
| 7,616,132 | B2 * | 11/2009 | Chan et al. | 341/50 |
| 2006/0028359 | A1 * | 2/2006 | Kim et al. | 341/50 |
| 2006/0232452 | A1 * | 10/2006 | Cha | 341/50 |

* cited by examiner

*Primary Examiner* — Peguy JeanPierre
(74) *Attorney, Agent, or Firm* — Staas & Halsey LLP

(57) ABSTRACT

A lossless coding and/or decoding apparatus and method. The lossless coding apparatus may read a probability model corresponding to each of a plurality of context groups. Here, the probability model stored in a memory may be generated by grouping a context. The lossless coding apparatus may code a symbol using the probability model and generate a bitstream. The lossless coding apparatus may enhance coding efficiency and reduce an amount of space utilized by the memory.

17 Claims, 10 Drawing Sheets

G0 = {0, 3}
G1 = {1, 2}

| P(0/G0) = 0.7 | P(1/G0) = 0.3 |
| --- | --- |
| P(0/G1) = 0.6 | P(1/G1) = 0.4 |

APPARATUS AND METHOD FOR LOSSLESS CODING AND DECODING

CROSS-REFERENCE TO RELATED APPLICATIONS

This application claims the benefit of Korean Patent Application No. 10-2008-0084368, filed on Aug. 28, 2008, in the Korean Intellectual Property Office, the disclosure of which is incorporated herein by reference.

BACKGROUND

1. Field

One or more embodiments relate to a coding and decoding method of an audio signal, and more particularly, to a lossless coding and decoding method.

2. Description of the Related Art

Coding refers to converting an audio signal into a digital bitstream, and decoding refers to converting the digital bitstream into the audio signal. The decoding operations may correspond to an opposite of the coding operations.

The coding of the audio signal may include estimating attributes of the audio signal, quantizing the estimated attributes, and losslessly coding the quantized sample or symbol.

The estimating of the attributes of the audio signal may be performed by converting an audio signal in a time domain into a spectrum component in a frequency domain.

During the course of the quantization of the estimated attribute, a portion of the audio signal information may be lost. As the loss of audio signal information increases, it may be more difficult to restore the original audio signal via the coding and decoding operations.

To easily perform signal processing with respect to the quantized sample or symbol, the sample or symbol may be converted into a bitstream. In this instance, an operation of converting information included in the sample or symbol into a bitstream without loss refers to lossless coding, and decoding the sample or symbol without loss from the bitstream refers to lossless decoding.

SUMMARY

According to embodiments, it may be possible to enhance coding efficiency and reduce a required space for a memory.

Also, according to embodiments, it may be possible to reduce a memory space utilized in performing N-ary arithmetic coding with lower complexity.

Also, according to embodiments, it may be possible to reduce a memory space utilized for storing a probability model based on context.

Additional aspects and/or advantages will be set forth in part in the description which follows and, in part, will be apparent from the description, or may be learned by practice of the invention.

According to embodiments, a lossless coding apparatus may include: an extraction unit to extract a context of a first symbol among sequential symbols; a determination unit to determine a group including the extracted context among a plurality of context groups; a memory to store a probability model corresponding to each of the plurality of context groups; and an encoder to encode the first symbol and generating a bitstream, based on the probability model and the determined group.

According to other embodiments, a lossless decoding apparatus may include: an extraction unit to extract context of the first bitstream among serial bitstreams from previously decoded symbol; a determination unit to determine a group including the extracted context among the plurality of context groups; a memory to store a probability model corresponding to each of the plurality of context groups; and a decoder to decode the first bitstream and to generate a first symbol, based on the probability model and the determined group.

According to still other embodiments, a lossless coding method may include: extracting a context of a first symbol among sequential symbols; determining a group including the extracted context among the plurality of context groups; reading a probability model corresponding to each of the plurality of context groups in a memory; and encoding the first symbol and generating a bitstream, based on the probability model and the determined group.

According to yet other embodiments, a lossless decoding method may include: extracting context of the first bitstream among serial bitstreams from previously decoded symbol; determining a group including the extracted context among the plurality of context groups; reading a probability model corresponding to each of the plurality of context groups in a memory; and decoding the first bitstream and generating the first symbol, based on the probability model and the determined group.

Additional aspects, characteristics, and/or advantages of the embodiments will be set forth in part in the description which follows and, in part, will be apparent from the description, or may be learned by practice of the disclosure.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION

Figure 1:
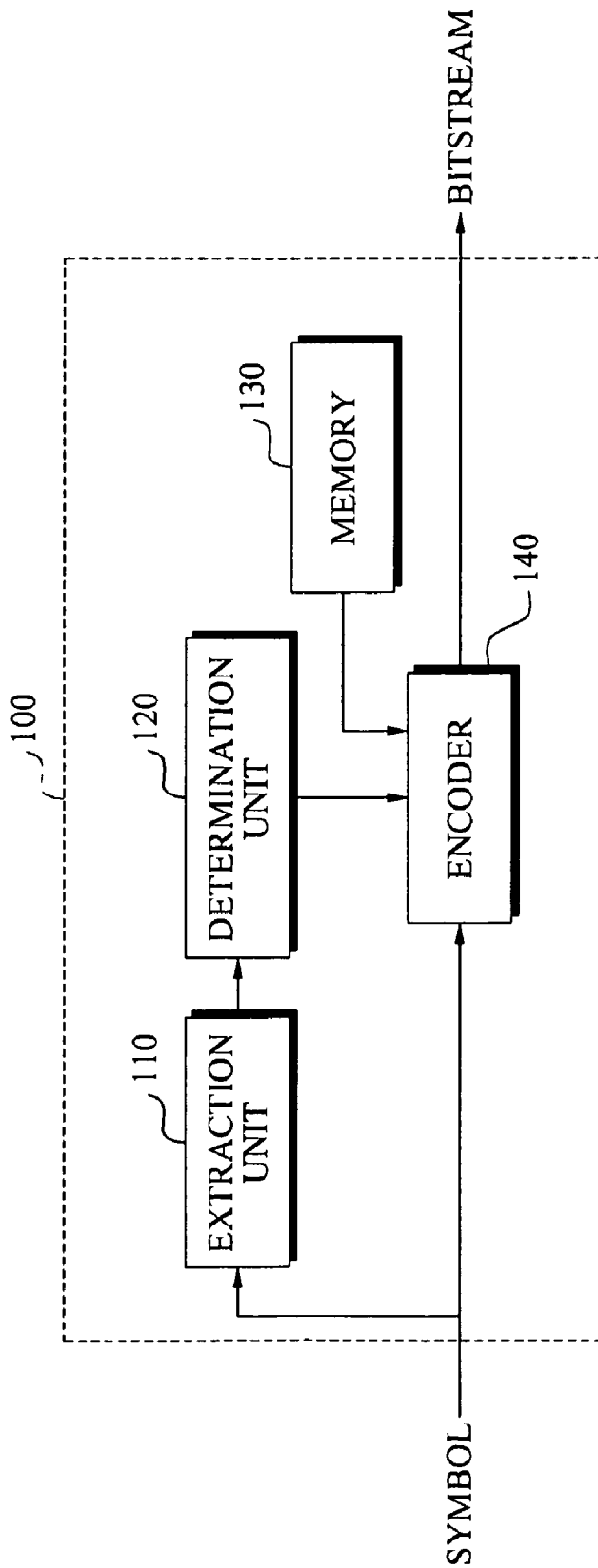
FIG. 1 is a diagram illustrating a lossless coding apparatus according to embodiments.

Reference will now be made in detail to embodiments, examples of which are illustrated in the accompanying drawings, wherein like reference numerals refer to the like elements throughout. Embodiments are described below to explain the present disclosure by referring to the figures.

FIG. 1 is a diagram illustrating a lossless coding apparatus 100 according to embodiments.

Referring to FIG. 1, the lossless coding apparatus 100 may include an extraction unit 110, a determination unit 120, a memory 130, and an encoder 140.

The lossless coding apparatus 100 may receive sequential symbols, code the sequential symbols, generate sequential bitstreams, and output the sequential bitsteams.

Coding operations of an audio signal may include estimating attributes of the audio signal, quantizing the estimated attributes, and losslessly coding the quantized symbols.

The estimating of the attributes of the audio signal may convert the audio signal in a time domain into spectrum components in a frequency domain. As an example of the converting, there is modified discrete cosine transform (MDCT).

The quantizing of the estimated attributes may selectively quantize a portion of the spectrum components in the frequency domain. During the course of the quantization, a portion of the attributes of the audio signal may be lost. A selective algorithm which reduces losses of information may be used for the quantization.

The quantized symbol may be represented as location information in the frequency domain, and an amplitude and a sign of the selected frequency component.

The lossless coding apparatus 100 may perform bit by bit context binary arithmetic coding to code the location. In this instance, complexity and overhead may be increased in the lossless coding apparatus 100.

The lossless coding apparatus 100 may perform context-based N-ary arithmetic coding to code the location. In this instance, the lossless coding apparatus 100 may reduce complexity and overhead. To perform context-based arithmetic coding, the lossless coding apparatus 100 may store a probability model corresponding to each of context groups. The lossless coding apparatus 100 may reduce an amount of space utilized for the memory 130 to store the probability model by storing the probability model corresponding to each of the context groups.

The extraction unit 110 may extract a context of a first symbol based on the sequential symbols or environmental variables. Since the context of the first symbol is identically applied to a decoding operation, when a symbol is used as a context, a previously encoded symbol may be used for the context.

The determination unit 120 may determine a group including the extracted context among a plurality of context groups.

The memory 130 may store a probability model corresponding to each of the plurality of contexts groups.

The encoder 140 may encode the first symbol and generate a bitstream, based on the probability model and the determined group.

Each of the plurality of context groups may include at least one context. The plurality of contexts may be grouped based on a probability of each of a plurality of contexts. By grouping the plurality of contexts, a plurality of context groups may be generated.

As an example, when contexts A and B have an identical probability, the contexts A and B may be included in an identical context group. Also, when a probability difference between the context A and the context B is smaller than a threshold value, the contexts A and B may be included in a an identical context group.

A number of the plurality of contexts groups may be smaller than a number of a potential number of a context. As an example, when a context is represented in four bits, the context may have 16 different values. Probability models may be established with respect to all 16 values of the context. Each of the plurality of context groups may include two contexts and a number of the plurality of context groups may be 8.

The probability models may be determined based on a frequency of each symbol occurrence during the course of training.

Figure 2:
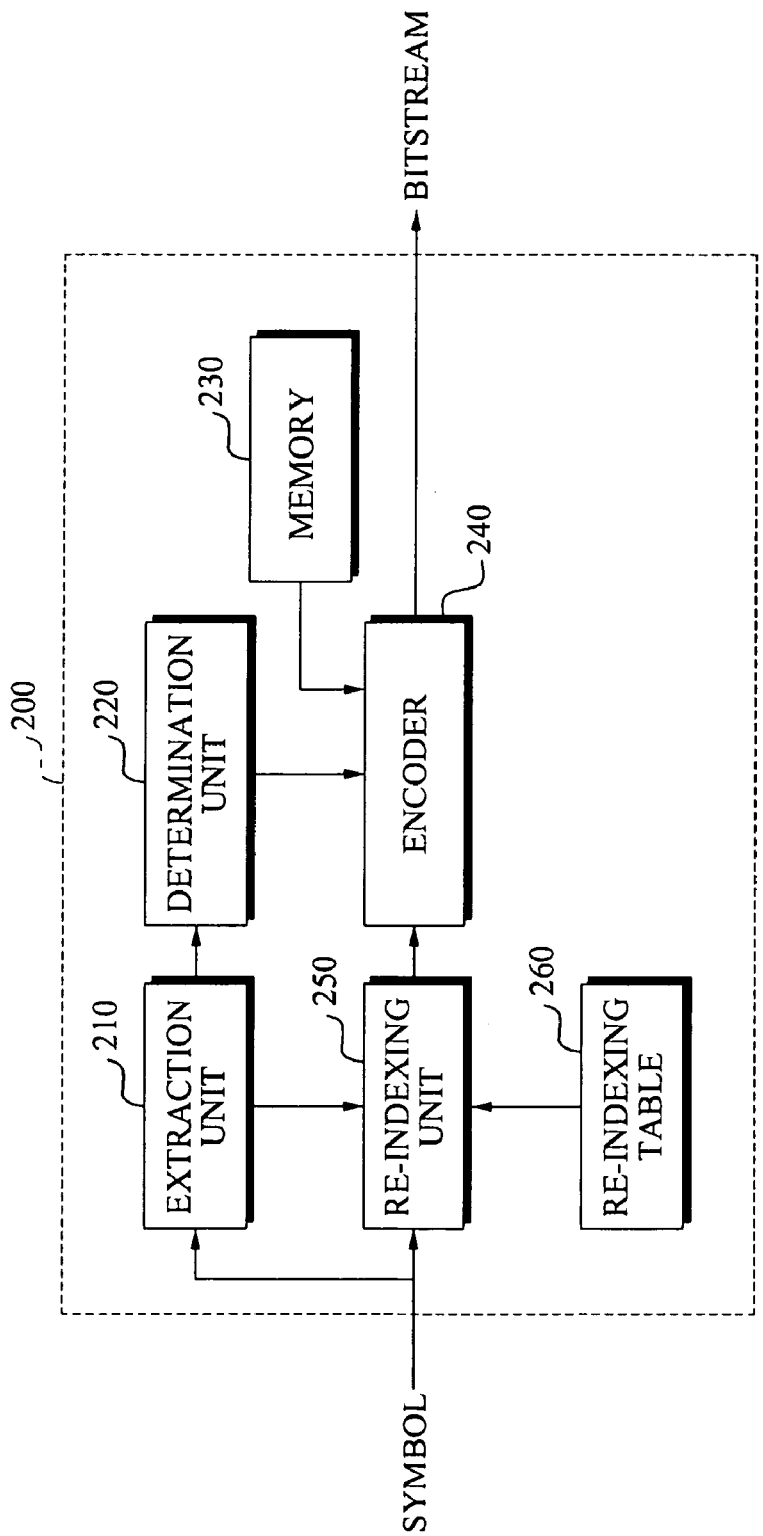
FIG. 2 is a diagram illustrating a lossless coding apparatus according to other embodiments.

FIG. 2 is a diagram illustrating a lossless coding apparatus 200 according to embodiments.

Referring to FIG. 2, the lossless coding apparatus 200 may include an extraction unit 210, a determination unit 220, a memory 230, an encoder 240, a re-indexing unit 250, and a re-indexing table 260.

The lossless coding apparatus 200 may receive sequential symbols, encode the sequential symbols, generate sequential bitstreams, and output the sequential bitstreams.

The determination unit 220 may determine a group including the extracted context among a plurality of contexts groups.

The memory 230 may store a probability model corresponding to each of the plurality of contexts groups.

The re-indexing table 260 may store re-indexing information about the sequential symbols. The re-indexing table 260 may store re-indexing information about each of potential values of a context.

The re-indexing unit 250 may re-index a first symbol and generate a second symbol, based on the stored re-indexing information and the extracted context.

The encoder 240 may encode the second symbol and generate a bitstream, based on the probability model and the determined group.

Figure 3:
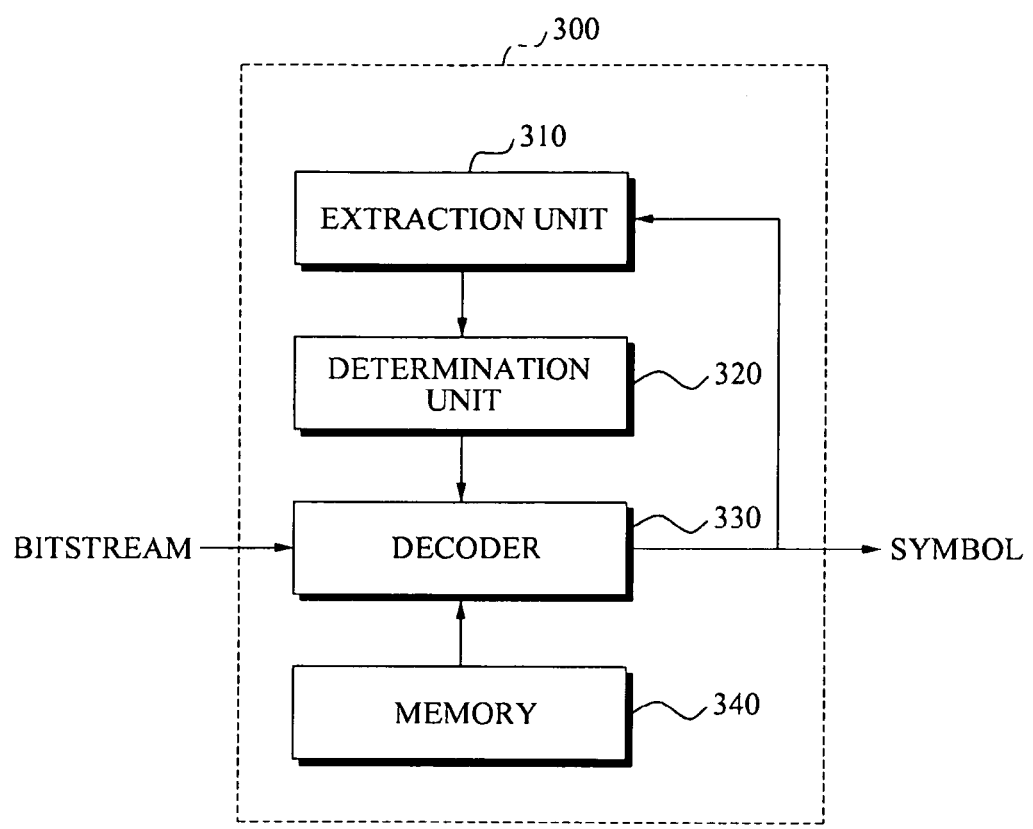
FIG. 3 is a diagram illustrating a lossless decoding apparatus according to embodiments.

FIG. 3 is a diagram illustrating a lossless decoding apparatus 300 according to embodiments.

Referring to FIG. 3, the lossless decoding apparatus 300 may include an extraction unit 310, a determination unit 320, a decoder 330, and a memory 340.

The lossless decoding apparatus 300 may receive sequential bitstreams, decode the sequential bitstreams, generate sequential symbols, and output the sequential symbols.

The extraction unit 310 may extract a context of a first bitstream among the sequential bitstreams from a previously decoded result or environmental variables during the course of the coding. In this instance, the extracted context may configure a context that is identical to the coding operation of the lossless coding apparatus 100 or 200.

The determination unit 320 may determine a group including the extracted context among the context groups.

The memory 340 may store a probability model corresponding to each of the plurality of context groups.

The decoder 330 may decode the first bitstream and generate the first symbol, based on the probability model and the determined group.

Each of the plurality of context groups may include at least one context. The plurality of context groups may be grouped based on a probability of each of the plurality of the contexts. By grouping the plurality of contexts, a plurality of context groups may be generated.

Similar to the description regarding the lossless coding apparatus 100 of FIG. 1, in the lossless decoding apparatus 300, when contexts A and B have an identical probability, the contexts A and B may be included in an identical context group. According to other embodiments of the lossless decoding apparatus 300, when a probability difference between the context A and the context B is smaller than a threshold value, the contexts A and B may be included in an identical context group.

Similar to the description regarding the lossless coding apparatus 100, in the lossless decoding apparatus 300, a number of the plurality of context groups is smaller than a potential number of a context.

Similar to the description regarding the lossless coding apparatus 100, in the lossless decoding apparatus 300, a probability mode may be determined based on a frequency of occurrence of each symbol during the course of training of the sequential symbols.

Figure 4:
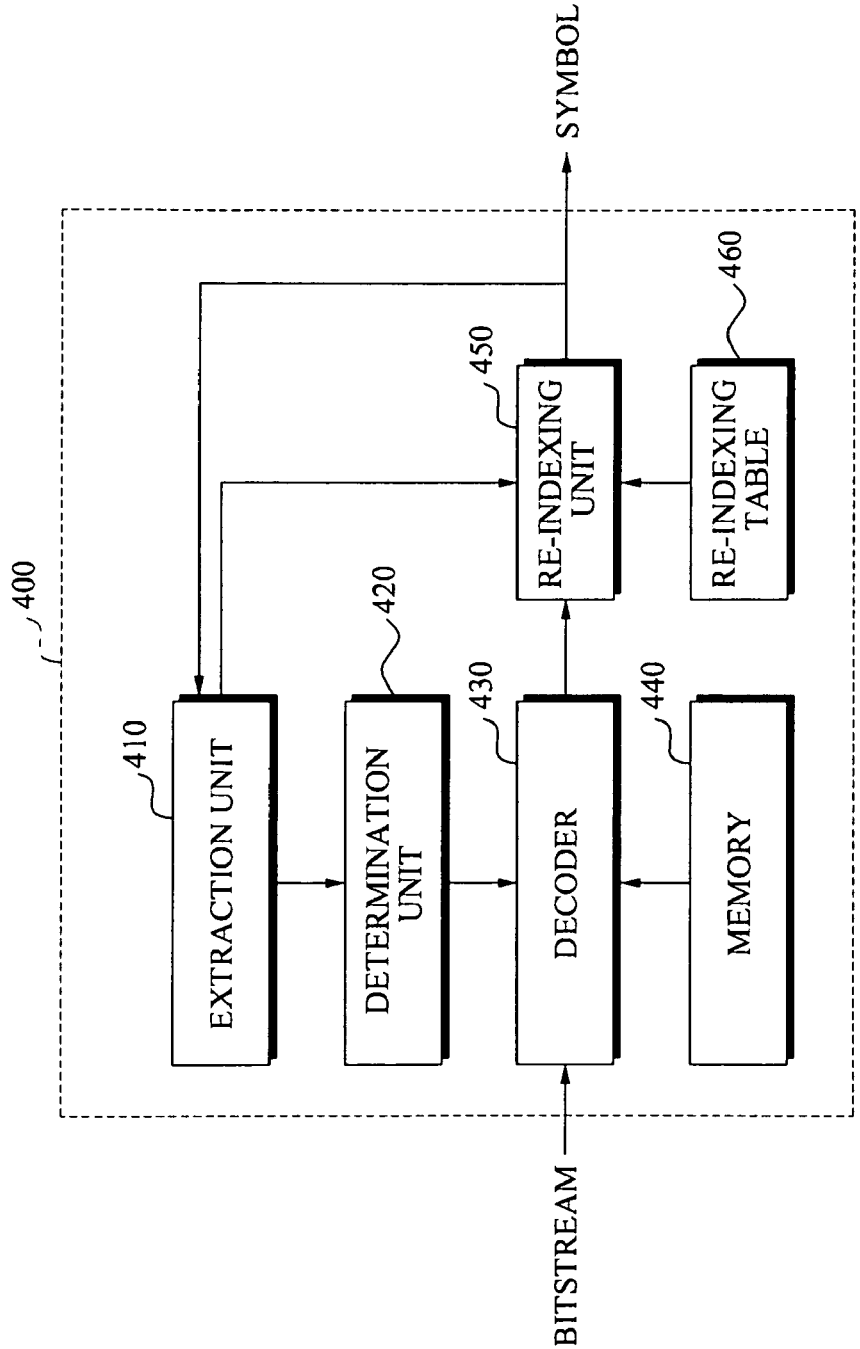
FIG. 4 is a diagram illustrating a lossless decoding apparatus according to other embodiments.

FIG. 4 is a diagram illustrating a lossless decoding apparatus 400 according to an embodiment.

Referring to FIG. 4, the lossless decoding apparatus 400 may include an extraction unit 410, a determination unit 420, a decoder 430, a memory 440, a reindexing unit 450, and a re-indexing table 460.

The lossless decoding apparatus 400 may receive sequential bitstreams, decode sequential bitstreams, generate sequential symbols, and output the sequential symbols.

The extraction unit 410 may extract a context of a first bitstream among the sequential bitstreams from a previously decoded result or environmental variables used during the course of the coding. In this instance, the extracted context may configure a context that is identical to the coding operation of the lossless coding apparatuses 100, 200 and 300.

The determination unit 420 may determine a group including the extracted context among a plurality of context groups.

The memory 440 may store a probability model corresponding to each of the plurality of contexts groups.

The re-indexing table 460 may store re-indexing information about the sequential symbols. The re-indexing table 460 may store re-indexing information about a symbol of each of potential values of a context.

The re-indexing table 460 may re-index a first symbol and generate a second symbol, based on the stored re-indexing information and the extracted context.

The re-indexing unit 450 may re-index the first symbol based on the stored re-indexing information and the extracted context, generate a second symbol, and output the second symbol.

Figure 5:
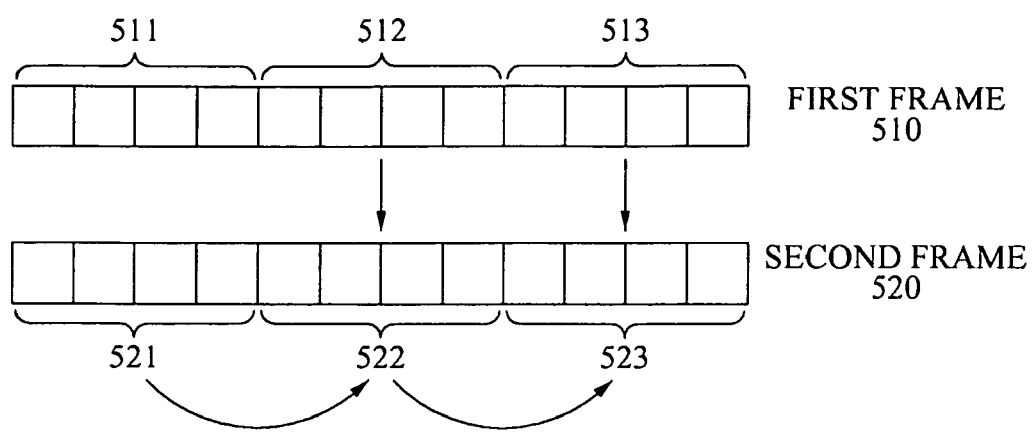
FIG. 5 is a diagram illustrating extracting of a context performed by the lossless coding apparatus of FIG. 1 and/or by the lossless coding apparatus of FIG. 2.

FIG. 5 is a diagram illustrating extracting of a context performed by the lossless coding apparatus 100 of FIG. 1 and/or by the lossless coding apparatus 200 of FIG. 2.

The lossless coding apparatuses 100 and 200 may receive and code sequential symbols by a frame unit.

Referring to FIG. 5, a first frame 510 may include three symbols 511, 512, and 513, and a second frame may include three symbols 521, 522, and 523.

Each of symbols 511, 512, 513, 521, 522, and 523 may be represented using four bits. Thus, each of symbols 511, 512, 513, 521, 522, and 523 may have one of 16 different values.

The lossless coding apparatuses 100 and 200 may extract a context of the symbol 522 to code the symbol 522. The lossless coding apparatuses 100 and 200 may extract a context of the symbol 522 based on a value of the symbol 521, which is a symbol previous to the symbol 522, and may extract the context of the symbol 522 based on the value of the symbol 512 existing in a location identical to the symbol 522 from among the symbols of the first frame 510, the first frame being a frame previous to the second frame 520 including the symbol 522.

Similarly, the lossless coding apparatuses 100 and 200 may extract a context of the symbol 523 to code the symbol 523.

The lossless coding apparatuses 100 and 200 may extract the context of the symbol 523 based on values of the symbols 522 and 513.

A scheme which refers to the value of the symbol 512 of the first frame 510 for extracting the context of the symbol 522 is referred to as inter frame prediction, and a scheme which refers to the value of the symbol 521 for extracting the context of the symbol 522 is referred to as intra frame prediction.

When the lossless coding apparatuses 100 and 200 perform context based coding, and when a probability model corresponding to combinations of all contexts, which can occur by performing inter frame prediction and intra frame prediction, is stored in the memories 130 and 230, the lossless coding apparatuses 100 and 200 may maximize coding efficiency.

The lossless coding apparatuses 100 and 200 may reduce spaces of the memory 130 and 230 required for storing the probability model. The lossless coding apparatuses 100 and 200 may generate a plurality of context groups by grouping all potential values of a context based on probability.

The symbol 512 of the first frame 510 may have any one of 16 values, and the symbol 521 of the second frame 520 may have any one of 16 values, the first frame 510 being used as a reference to extract the context of the symbol 522. Accordingly, the context of the symbol 522 may have any one of 256 values.

The lossless coding apparatuses 100 and 200 may select values, having an identical probability with each other or similar probability with each other among 256 values, as a single context group. As an example, the lossless coding apparatuses 100 and 200 may divide probability intervals [0, 1] into a plurality of small intervals, and select context values having a probability included in each of the plurality of small durations to be included in an identical context group.

When a symbol value of a previous frame is '5', and when a previous symbol value is '10', a probability model P may be represented as P(5, 10). Similarly, when a symbol value of a previous frame is '10', and when a previous symbol value is '5', a probability model may be represented as P(10, 5).

When P(5, 10)=P(10, 5), the lossless coding apparatuses 100 and 200 may select (5, 10) and (10, 5) to be included in an identical context group.

Figure 6:
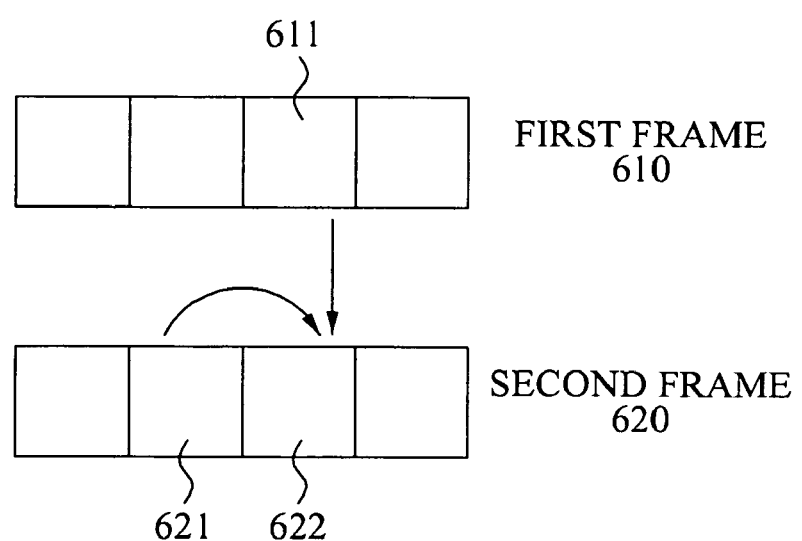
FIG. 6 is a diagram illustrating another method of extracting a context performed by the lossless coding apparatus of FIG. 1 and/or by the lossless coding apparatus of FIG. 2.

For a more concise explanation, a briefer embodiment is illustrated in FIG. 6.

FIG. 6 is a diagram illustrating another method of extracting a context performed by the lossless coding apparatus 100 of FIG. 1 and/or by the lossless coding apparatus 200 of FIG. 2.

The lossless coding apparatuses 100 and 200 may extract a context of a symbol 622 to code the symbol 622 of a second frame 620. The lossless coding apparatuses 100 and 200 may extract the context of the symbol 622 based on a previous symbol 621 of the symbol 622 and a value of a symbol 611 of a first frame 610 of being a previous frame.

Since the symbol 621 may have any one of two values and the symbol 611 may have any one of two values, the context of the symbol 622 may have any one of four values.

Figure 7:
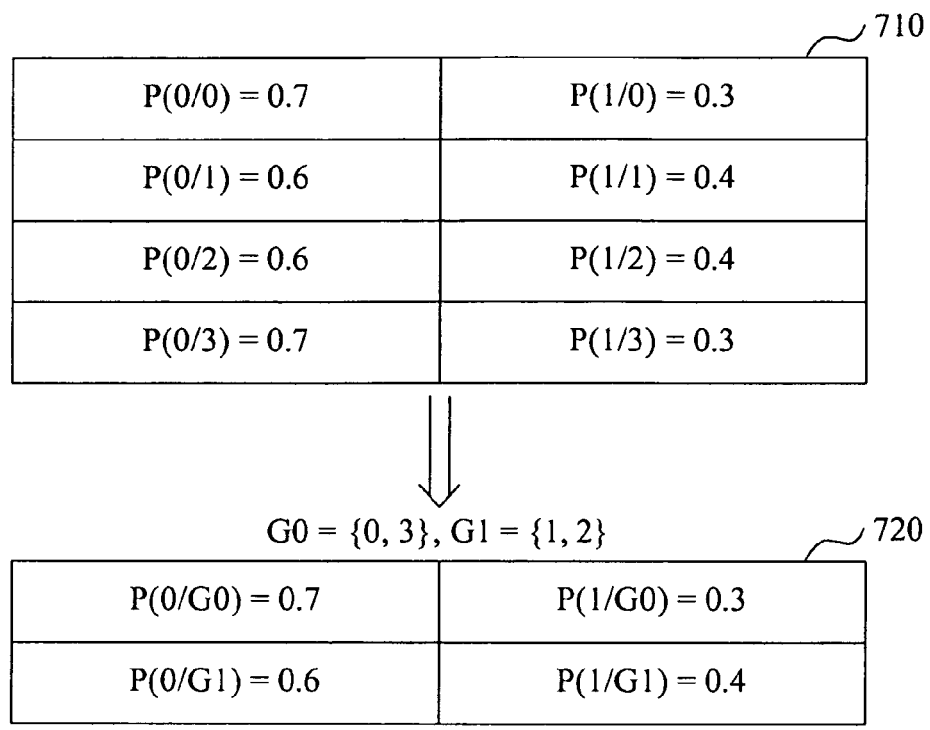
FIG. 7 is a diagram illustrating an example of a probability model before grouping according to an embodiment of FIG. 6 and a probability model which is to be stored in a memory of FIG. 1.

FIG. 7 is a diagram illustrating an example of a probability model 710 before grouping according to the embodiment of FIG. 6 and a probability model 720 which is to be stored in the memory 130 of FIG. 1.

Referring to FIG. 7, when a context of the symbol 622 is '0', a conditional probability of the symbol 622 being '0' is represented as P(0/0), and P(0/0)=0.7.

When a context of the symbol 622 is '0', a conditional probability of the symbol 622 being '1' is represented as P(1/0), and P(1/0)=0.3.

When a context of the symbol 622 is '1', a conditional probability of the symbol 622 being '0' is represented as P(0/1), and P(0/1)=0.6, and when the context of the symbol 622 is '1', a conditional probability of the symbol 622 being '1' is represented as P(1/1), and P(1/1)=0.4.

When a context of the symbol 622 is '2', a conditional probability of the symbol 622 being '0' is represented as P(0/2), and P(0/2)=0.6, and when the context of the symbol 622 is '2', a conditional probability of the symbol 622 being '1' is represented as P(1/2), and P(1/2)=0.4.

When a context of the symbol 622 is '3', a conditional probability of the symbol 622 being '0' is represented as P(0/3), and P(0/3)=0.7, and when the context of the symbol 622 is '3', a conditional probability of the symbol 622 being '1' is represented as P(1/3), and P(1/3)=0.3.

Since the probability models are identical with each other when the context of the symbol 622 is '0' and when the context of the symbol 622 is '3', a context group G0 may be established as G0={0, 3}.

Similarly, since the probability models are identical with each other when the context of the symbol 622 is '1' and when the context of the symbol 622 is '2', a context group G1 may be established as G1={1, 2}.

When a context of the symbol 622 is the context group G0, a conditional probability of the symbol 622 being '0' is represented as P(0/G0), and P(0/G0)=0.7, and when a context of the symbol 622 is the context group G0, a conditional probability of the symbol 622 being '1' is represented as P(1/G0), and P(1/G0)=0.3.

When a context of the symbol 622 is the context group G1, a conditional probability of the symbol 622 being '0' is represented as P(0/G1), and P(0/G1)=0.6, and when a context of the symbol 622 is the context group G1, a conditional probability of the symbol 622 being '1' is represented as P(1/G1), and P(1/G1)=0.4.

The memory 130 may reduce an amount of space utilized for storing a probability model by storing the probability model 720 which corresponds to the context groups G0 and G1.

Figure 8:
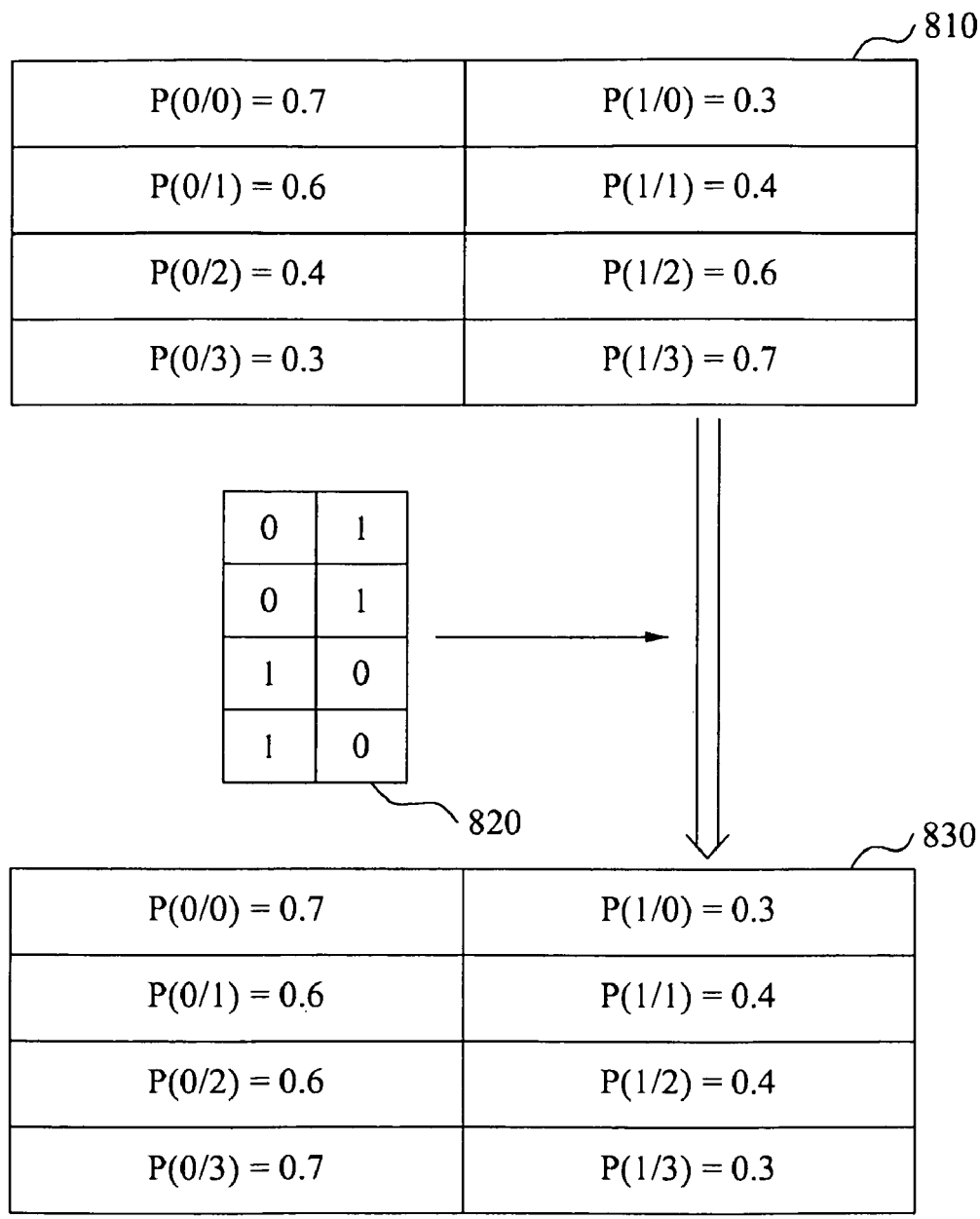
FIG. 8 is a diagram illustrating a probability model before grouping according to the embodiment of FIG. 6 and a converted probability model.

FIG. 8 is a diagram illustrating a probability model 810 before grouping and a converted probability model 830 according to the embodiment of FIG. 6.

FIG. 8 also illustrates re-indexing information 820 which is to be stored in the re-indexing table 260 of FIG. 2.

Referring to the probability model 810, it may be understood a probability model when the context of the symbol 622 being '0' is inversely mapped with a probability model when the context of the symbol 622 is '3', that is P(0/0)=P(1/3)=0.7, P(1/0)=P(0/3).

Also, referring to the probability model 810, a probability model when the context of the symbol 622 being '1' is inversely mapped with a probability model when the context of the symbol 622 is '2', that is P(0/1)=P(1/2)=0.6, P(1/1)=P(0/2)=0.4.

Referring to the probability model 820, the re-indexing unit 250 of FIG. 2 may generate the symbol 622 as a second symbol when a context of the symbol 622 is '1' or '0', and generate an inverse bit of the symbol 622 as a second symbol when the symbol 622 is '2' or '3'.

The encoder 240 of FIG. 2 may code the second symbol based on the second symbol and the converted probability model 830. The converted probability model 830 may be considered as a probability model corresponding to a context of the second symbol.

The memory 230 of FIG. 2 may generate context groups based on the converted probability model 830.

Figures 9, 10:
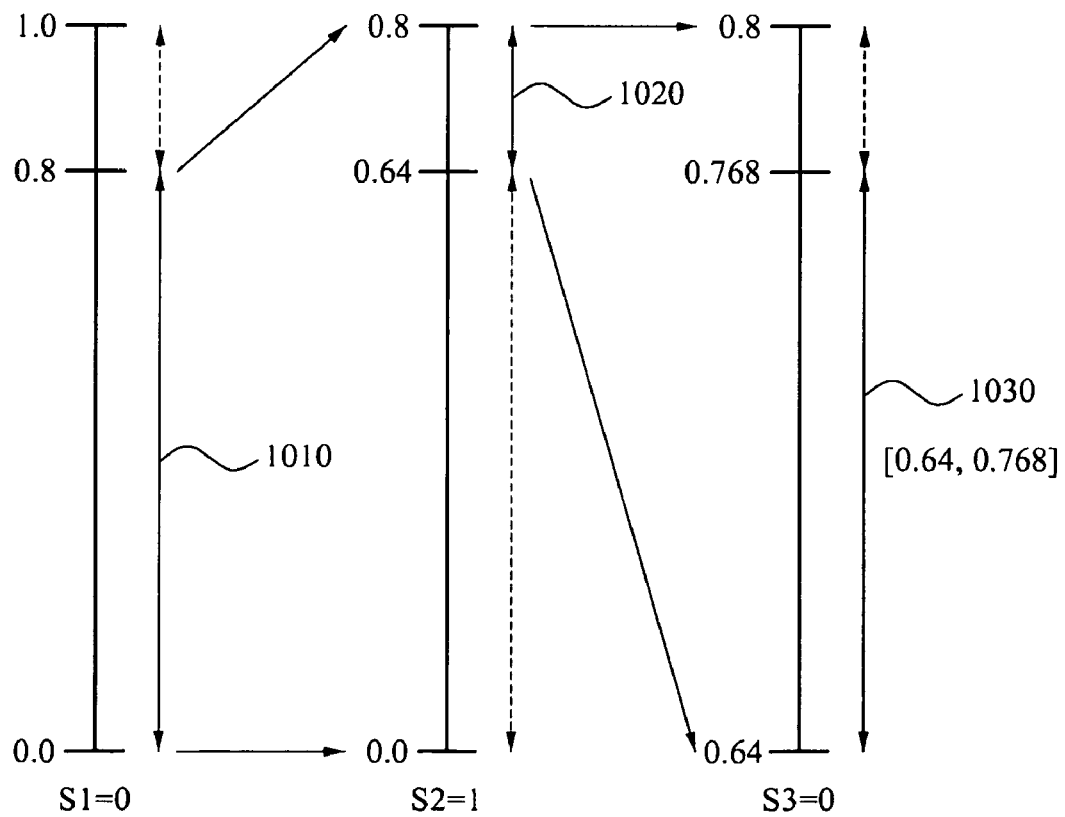
FIG. 9 is a diagram illustrating a probability model stored in a memory of FIG. 2.
FIG. 10 is a diagram illustrating coding operations performed by the lossless coding apparatus of FIG. 1 and/or the lossless coding apparatus of FIG. 2.

FIG. 9 is a diagram illustrating a probability model stored in the memory 230 of FIG. 2.

The context group G0 may be selected as G0={0, 3} based on the converted probability model 830. The context group G1 may be selected as G1={1, 2} based on the converted probability model 830.

Referring to FIG. 9, when a context of the second symbol is the context group G0, a conditional probability of the second symbol being '0' is represented as P(0/G0), and P(0/G0)=0.7, and when a context of the second symbol is the context group G0, a conditional probability of the second symbol being '1' is represented as P(1/G0) and P(1/G0)=0.3.

When a context of the second symbol is the context group G1, a conditional probability of the second symbol being '0' is represented as P(0/G1), and P(0/G1)=0.6, and when a context of the second symbol is the context group G1, a conditional probability of the second symbol being '1' is represented as P(1/G1) and P(1/G1)=0.4.

The lossless coding apparatuses 100 and/or 200 may determine whether re-indexing may be performed based on the probability model. When a probability model follows the embodiment of FIG. 7, the lossless coding apparatuses 100 and/or 200 may determine re-indexing may not be performed, and when a probability model follows the embodiment of FIG. 8, the lossless coding apparatuses 100 and/or 200 may determine re-indexing is required.

FIG. 10 is a diagram illustrating coding operations performed by the lossless coding apparatus 100 of FIG. 1 and/or the lossless coding apparatus 100 of FIG. 2.

Referring to FIG. 10, operations of performing arithmetic coding with respect to three sequential symbols S1, S2, and S3 is illustrated.

It is assumed that a probability of an arbitrary symbol being '1' is 0.2 and a probability of an arbitrary symbol being '0' is 0.8.

A probability interval [0, 1] may be divided into a probability interval [0.0, 0.8] 1010 of the symbol being S1 '0' and a probability interval [0.8, 1.0] of the symbol S1 being '1'. Since the symbol S1 is '0', a lossless coding apparatus 800 may select a probability interval 1010.

The probability interval 1010 may be divided into a probability interval [0.0, 0.64] of the symbol S2 being '0' and a probability interval [0.64, 0.80] 1020 of the symbol S2 being '1'. Since the symbol S2 is '1', the lossless coding apparatus 800 may select a probability interval 1020.

The probability interval 1020 may be divided into a probability interval [0.64, 0.768] 1030 of the symbol S3 being '0' and a probability interval [0.768, 0.80] of the symbol S3 being '3'.

The lossless coding apparatus 800 may select the probability interval 1030 with respect to the three sequential symbols S1, S2, and S3, and generate a codeword corresponding to the probability interval 1030.

The lossless coding apparatus 800 may select a codeword which is capable of representing the probability interval [0.64, 0.768] 1030 with a smallest number of bits. As an example, the lossless coding apparatus 800 may select '11' as a codeword corresponding to the probability interval 1030 from 0.11 (binary)=0.75 (decimal).

In this instance, since the three sequential symbols S1, S2, and S3 may be represented in two bits, it may be understood that 2/3 bits per symbol is used.

In FIG. 10, an example of binary arithmetic coding is described, however the present disclosure is not limited thereto, and N-ary arithmetic coding may be performed depending on other embodiments.

The lossless coding apparatuses 100 and 200 according to embodiments may symbolize a location and perform inter frame prediction and/or intra frame prediction with respect to a symbol, when location coding is performed.

The lossless coding apparatuses 100 and 200 according to the embodiments may extract a context with respect to a symbol based on a prediction result. The lossless decoding apparatuses 300 and 400 of FIGS. 3 and 4 may extract a context with respect to a bitstream based on a result of prediction.

The lossless coding apparatuses 100 and 200 or the lossless decoding apparatuses 300 and 400 may generate a context group based on a probability of the extracted context.

The lossless coding apparatus 200 or the lossless decoding apparatus 400 may re-index a symbol or a bitstream based on a value of the extracted context value. The lossless coding apparatus 200 or the lossless decoding apparatus 400 may perform inter frame prediction and/or intra frame prediction with respect to a re-indexed symbol or a re-indexed bitstream.

Figure 11:
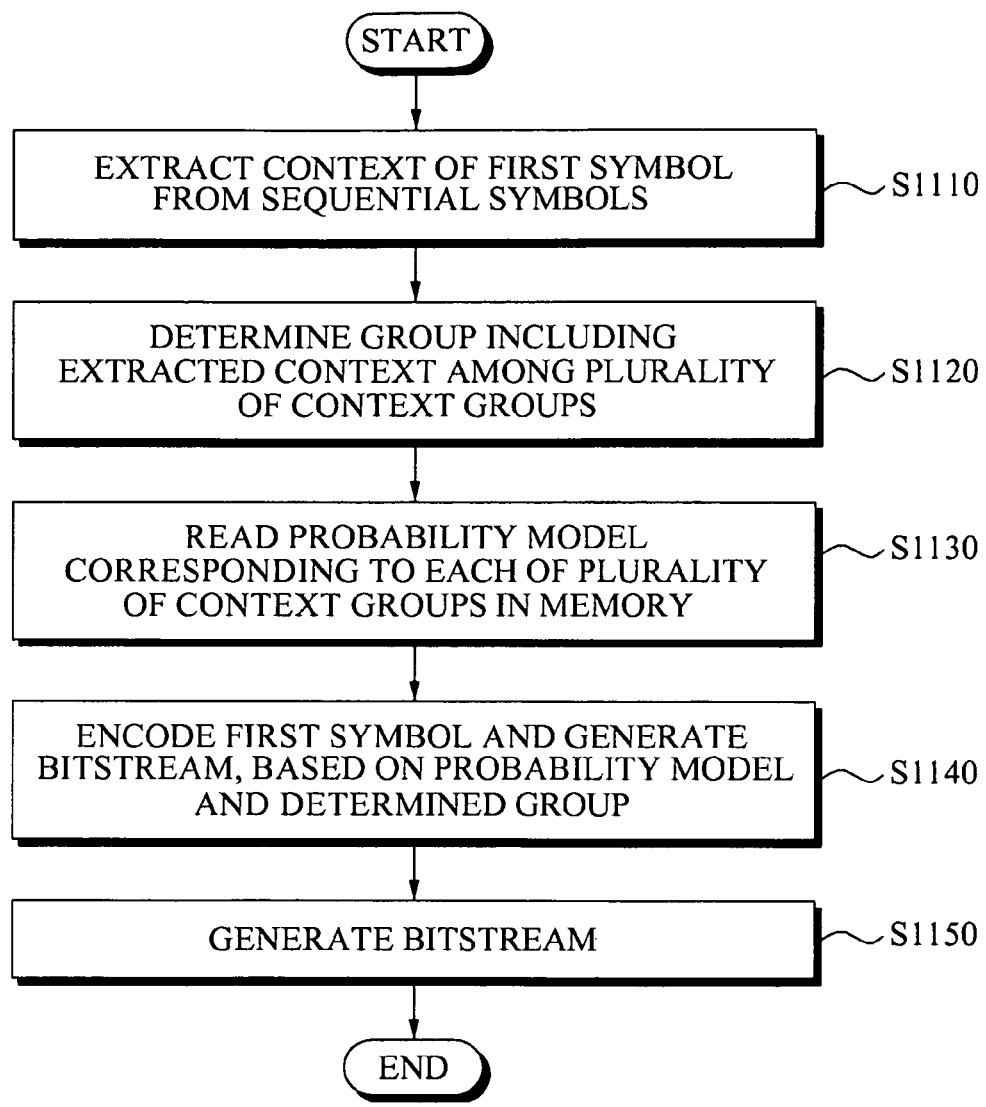
FIG. 11 is flowchart illustrating a lossless coding method according to embodiments.

FIG. 11 is flowchart illustrating a lossless coding method according to embodiments.

Referring to FIG. 11, the lossless coding method may extract a context of a first symbol among sequential symbols in operation S1110. The lossless coding method may extract the context of the first symbol by performing any one or both of inter frame prediction and intra frame prediction.

In operation S1120, the lossless coding method may determine a group including the extracted context from among a plurality of context groups.

In operation S1130, the lossless coding method may read a probability model corresponding to each of the plurality of context groups.

In operation S1140, the lossless coding method may code the first symbol based on the probability model and the determined group.

In operation S1150, the lossless coding method may generate a bitstream from the coded first symbol.

The lossless coding method may estimate a probability corresponding to each of the plurality of contexts. The lossless coding method may perform grouping with respect to each of the plurality of context groups based on the estimated probability. The lossless coding method may generate a plurality of context groups by grouping each of the plurality of contexts. The lossless coding method may store a probability model corresponding to each of the plurality of context groups in a memory.

The lossless coding method may generate re-indexing information about sequential symbols based on the estimated probability. The lossless coding method may store the re-indexing information in a re-indexing table.

The lossless coding method may read the re-indexing information in the re-indexing table. The lossless coding method may re-index the first symbol and generate a second symbol, based on the extracted context and re-indexing information. In this instance, operation S1140 may code the second symbol instead of the first symbol.

Figure 12:
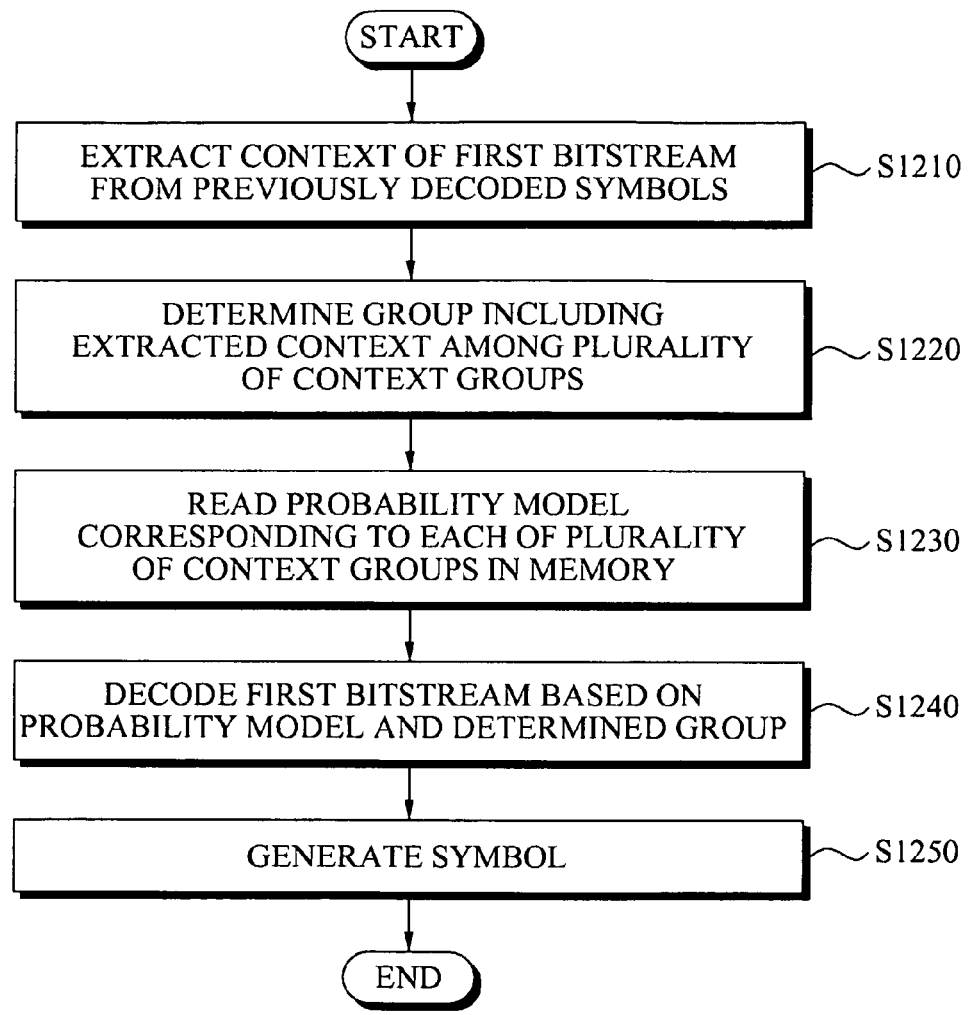
FIG. 12 is a flowchart illustrating a lossless decoding method according to embodiments.

FIG. 12 is a flowchart illustrating a lossless decoding method according to embodiments.

Referring to FIG. 12, the lossless decoding method may extract a context of a first bitstream among sequential bitstreams based on a previously decoded result or environmental variables when encoding in operation S1210. The lossless decoding method may extract the context of the first bitstream by performing any one or both of inter frame prediction and intra frame prediction.

In operation S1220, the lossless decoding method may determine a group including the extracted context from among a plurality of context groups.

In operation S1230, the lossless decoding method may read a probability model corresponding to each of the plurality of context models in a memory.

In operation S1240, the lossless decoding method may decode the first bitstream based on the probability model and the determined group.

In operation S1250, the lossless decoding method may generate a symbol from the decoded first bitstream.

The lossless decoding method may estimate a probability corresponding to each of a plurality of contexts. The lossless decoding method may perform grouping with respect to each of the plurality of contexts based on the estimated probability. The lossless decoding method may generate a plurality of contexts groups by grouping each of the plurality of context groups. The lossless decoding method may store a probability model corresponding to each of the plurality of context groups in a memory.

The lossless decoding method may generate re-indexing information about the sequential symbols based on the estimated probability. The lossless decoding method may store the re-indexing information in a re-indexing table.

The lossless decoding method may read the re-indexing information in the re-indexing table. The lossless decoding method may re-index the generated symbol and generate the re-indexed symbol, based on the extracted context and the re-indexing information. The lossless decoding method may output the re-indexed symbol.

The lossless coding and/or decoding method according to the above-described embodiments may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks, Blu-ray disks (BD) and DVD; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A lossless coding apparatus, the apparatus comprising:
an extraction unit to extract a context of a first symbol among sequential symbols based on a value of a preceding symbol among the sequential symbols;
a determination unit to determine a group including the extracted context among a plurality of context groups, wherein at least one of the plurality of context groups is generated by grouping a plurality of different contexts based on a probability of each of the plurality of contexts such that when a probability difference between a first context and a second context is smaller than a predetermined threshold value, the determination unit includes the first context and the second context in an identical context group;
a memory to store a probability model corresponding to each of the plurality of context groups; and
an encoder to encode the first symbol and generate a bitstream, based on the probability model and the determined group.

2. The apparatus of claim 1, wherein a number of the plurality of context groups is generated to be smaller than a number of different contexts to reduce an amount of memory space needed to store the plurality of context groups.

3. The apparatus of claim 1, further comprising:
a re-indexing table to store re-indexing information about the sequential symbols; and
a re-indexing unit to re-index the first symbol and to generate a second symbol, based on the stored re-indexing information and the extracted context, wherein the encoder encodes the second symbol and generates the bitstream.

4. The apparatus of claim 1, wherein the extraction unit extracts the context of the first symbol based on a second symbol existing in an identical location to the first symbol among previous frames of the first symbol and a third symbol, which is a previous symbol of the first symbol.

5. The apparatus of claim 1, wherein the probability model is determined based on a frequency of occurrence of each symbol during training of the sequential symbols.

6. A lossless decoding apparatus, the apparatus comprising:
an extraction unit to extract a context of a first bitstream among serial bitstreams from a previously decoded symbol, wherein the extraction unit extracts the context of the first bitstream based on a preceding bitstream among the serial bitstreams;
a determination unit to determine a group including the extracted context from among a plurality of context groups, wherein at least one of the plurality of context groups is generated by grouping a plurality of different contexts based on a probability of each of the plurality of contexts such that when a probability difference between a first context and a second context is smaller than a predetermined threshold value, the determination unit includes the first context and the second context in an identical context group;
a memory to store a probability model corresponding to each of the plurality of context groups; and
a decoder to decode the first bitstream and to generate a first symbol, based on the probability model and the determined group.

7. The apparatus of claim 6, wherein a number of the plurality of context groups is generated to be smaller than a number of different contexts to reduce an amount of memory space needed to store the plurality of context groups.

8. The apparatus of claim 6, further comprising:
a re-indexing table to store re-indexing information about the first symbol; and
a re-indexing unit to re-index the first symbol, and to generate and output a second symbol based on the stored re-indexing information and the extracted context.

9. The apparatus of claim 6, wherein the extraction unit extracts the context of the first bitstream based on a second bitstream existing in an identical location to the first bitstream among previous frames of the first bitstream and a third bitstream, which is a previous bitstream of the first bitstream.

10. A lossless coding method, the method comprising:
extracting a context of a first symbol among sequential symbols based on a value of a preceding symbol among the sequential symbols;
determining a group including the extracted context from among a plurality of context groups, wherein at least one of the plurality of context groups is generated by grouping a plurality of different contexts based on a probability of each of the plurality of contexts such that when a probability difference between a first context and a second context is smaller than a predetermined threshold value, the first context and the second context are included in an identical context group;
reading a probability model corresponding to each of the plurality of context groups in a memory; and
encoding the first symbol and generating a bitstream, based on the probability model and the determined group.

11. The method of claim 10, further comprising:
estimating a probability corresponding to each of a plurality of contexts;
grouping each of the plurality of contexts based on the estimated probability and generating the plurality of context groups.

12. The method of claim 10, further comprising:
reading re-indexing information in a re-indexing table, which stores re-indexing information about the sequential symbols; and
re-indexing the first symbol and generating a second symbol, based on the extracted context and the read re-indexing information,
wherein the coding of the first symbol and generating of the bitstream encodes the second symbol instead of the first symbol and generates the bitstream.

13. The method of claim 10, wherein the extracting of the context of the first symbol extracts based on a second symbol existing in an identical location to the first symbol among previous frames of the first symbol and a third symbol, which is a previous symbol of the first symbol.

14. At least one non-transitory medium comprising computer readable code to control at least one processing element in a computer to implement the method of claim 10.

15. A lossless decoding method, the method comprising:
extracting a context of a first bitstream among serial bitstreams from a previously decoded symbol, wherein the context of the first bitstream is extracted based on a preceding bitstream among the serial bitstreams;
determining a group including the extracted context among a plurality of context groups, wherein at least one of the plurality of context groups is generated by grouping a plurality of different contexts based on a probability of each of the plurality of contexts such that when a probability difference between a first context and a second context is smaller than a predetermined threshold value, the first context and the second context are included in an identical context group;

reading a probability model corresponding to each of the plurality of context groups in a memory; and decoding the first bitstream and generating the first symbol, based on the probability model and the determined group.

16. The method of claim 15, further comprising:

estimating a probability corresponding to each of a plurality of contexts; and grouping each of the plurality of contexts and generating the plurality of context groups based on the estimated probability.

17. The method of claim 15, further comprising:

reading re-indexing information in a re-indexing table, which stores re-indexing information about the first symbol;

re-indexing the first symbol and generating a second symbol, based on the extracted context and the read re-indexing information; and outputting the second symbol.

* * * * *

UNITED STATES PATENT AND TRADEMARK OFFICE
CERTIFICATE OF CORRECTION

PATENT NO. : 7,973,683 B2  
APPLICATION NO. : 12/320288  
DATED : July 5, 2011  
INVENTOR(S) : Ki Hyun Choo et al.

Page 1 of 1

It is certified that error appears in the above-identified patent and that said Letters Patent is hereby corrected as shown below:

Column 11, Line 27-35, Delete "3. The apparatus of claim 1, further comprising:
a re-indexing table to store re-indexing information about the sequential symbols; and
a re-indexing unit to re-index the first symbol and to generate a second symbol, based on the
    stored re-indexing information and the extracted context, wherein the encoder encodes the
second symbol and generates the bitstream." and
insert -- 3. The apparatus of claim 1, further comprising:
a re-indexing table to store re-indexing information about the sequential symbols; and
a re-indexing unit to re-index the first symbol and to generate a second symbol, based on the
    stored re-indexing information and the extracted context,
wherein the encoder encodes the second symbol and generates the bitstream. --, therefor.

Signed and Sealed this
Twenty-eighth Day of February, 2012

David J. Kappos
*Director of the United States Patent and Trademark Office*